(12) United States Patent
Fischer et al.

(10) Patent No.: US 11,705,882 B2
(45) Date of Patent: Jul. 18, 2023

(54) ACOUSTIC RESONATOR STRUCTURE

(71) Applicant: Intel Corporation, Santa Clara, CA (US)

(72) Inventors: Paul Fischer, Portland, OR (US); Mark Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1100 days.

(21) Appl. No.: 16/349,935

(22) PCT Filed: Dec. 29, 2016

(86) PCT No.: PCT/US2016/069289
§ 371 (c)(1),
(2) Date: May 14, 2019

(87) PCT Pub. No.: WO2018/125157
PCT Pub. Date: Jul. 5, 2018

(65) Prior Publication Data
US 2019/0341899 A1    Nov. 7, 2019

(51) Int. Cl.
*H03H 9/02* (2006.01)
*H03H 9/205* (2006.01)
*H03H 3/02* (2006.01)
*H03H 9/17* (2006.01)
*H03H 9/60* (2006.01)

(52) U.S. Cl.
CPC .......... *H03H 9/02007* (2013.01); *H03H 3/02* (2013.01); *H03H 9/172* (2013.01); *H03H 9/205* (2013.01); *H03H 9/60* (2013.01)

(58) Field of Classification Search
CPC .. H03H 9/02; H03H 9/15; H03H 9/54; H03H 9/58
See application file for complete search history.

(56) References Cited

U.S. PATENT DOCUMENTS

| 6,822,535 B2 * | 11/2004 | Ma | H03H 3/02 438/50 |
| 7,140,084 B2 * | 11/2006 | Yamada | H03H 9/587 29/25.35 |
| 7,245,060 B2 * | 7/2007 | Yamada | H03H 9/172 310/320 |

(Continued)

OTHER PUBLICATIONS

International Search Report and Written Opinion for International Patent Application No. PCT/US2016/069289, dated Jul. 11, 2019, 11 pages.

(Continued)

*Primary Examiner* — Hafizur Rahman
*Assistant Examiner* — Alan Wong
(74) *Attorney, Agent, or Firm* — Schwabe, Williamson & Wyatt, P.C.

(57) ABSTRACT

Modern RF front end filters feature acoustic resonators in a film bulk acoustic resonator (FBAR) structure. An acoustic filter is a circuit that includes at least (and typically significantly more) two resonators. The acoustic resonator structure comprises a substrate including sidewalls and a vertical cavity between the sidewalls and two or more resonators deposited in the vertical cavity.

13 Claims, 5 Drawing Sheets

(56) References Cited

U.S. PATENT DOCUMENTS

| | | | |
|---|---|---|---|
| 8,910,355 B2 | 12/2014 | Adkisson et al. | |
| 9,666,786 B2 * | 5/2017 | Ballandras | H03H 3/04 |
| 10,298,197 B2 * | 5/2019 | Lee | H03H 9/02102 |
| 2003/0112097 A1 | 6/2003 | Ma et al. | |
| 2008/0129412 A1 | 6/2008 | Osone et al. | |
| 2008/0268575 A1 | 10/2008 | Bouche et al. | |
| 2016/0197596 A1 | 7/2016 | Hurwitz et al. | |

OTHER PUBLICATIONS

International Search Report and Written Opinion for International Patent Application No. PCT/US2016/069289 dated Sep. 21, 2017, 15 pgs.

* cited by examiner

ACOUSTIC RESONATOR STRUCTURE

CROSS-REFERENCE TO RELATED APPLICATION

This patent application is a U.S. National Phase Application under 35 U.S.C. § 371 of International Application No. PCT/US2016/069289, filed Dec. 29, 2016, entitled "ACOUSTIC RESONATOR STRUCTURE," which designates the United States of America, the entire disclosure of which is hereby incorporated by reference in its entirety and for all purposes.

FIELD

The present disclosure generally relates to acoustic resonator structures integrated in a radio frequency (RF) front end.

BACKGROUND

Modern RF front end filters feature acoustic resonators in a film bulk acoustic resonator (FBAR) structure. An acoustic filter is a circuit that includes at least (and typically significantly more) two resonators. FBAR devices are horizontal devices that are typically comprised of a sputtered Aluminum Nitride (AlN) piezoelectric material, where sputtered films are polycrystalline. Piezoelectric thickness sets operating frequency, which is controlled by precise film thickness control. Further, ion beam milling is typically used to compensate for wafer thickness variation of a piezoelectric layer. However, thickness tuning of each FBAR makes it difficult to manufacture multiple filters on a common die. This is typically not an issue for most commercial products, which feature only one filter per die. Nonetheless, Fourth Generation (4G) Long-Term Evolution (LTE) LTE wireless designs include upwards of 40 filters. Moreover, estimates for Fifth Generation (5G) may include as many as 140 filters due to the availability of highly fragmented frequency spectrum.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Figure 1A:
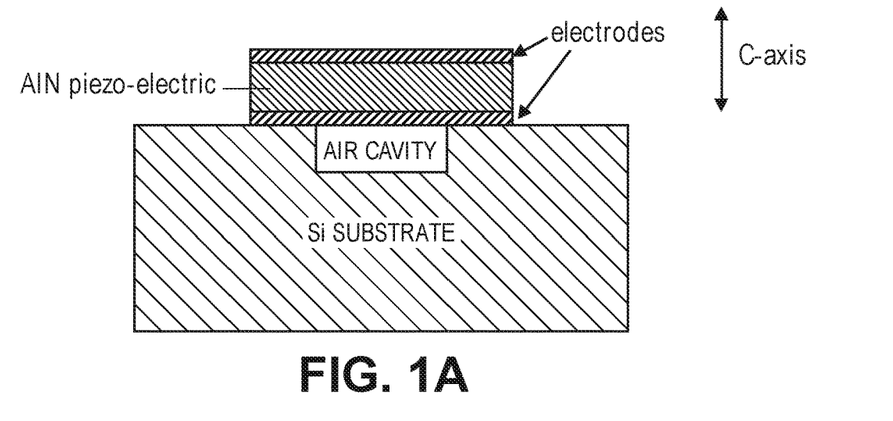
FIGS. 1A & 1B illustrate a conventional FBAR structure.
Figure 1B:
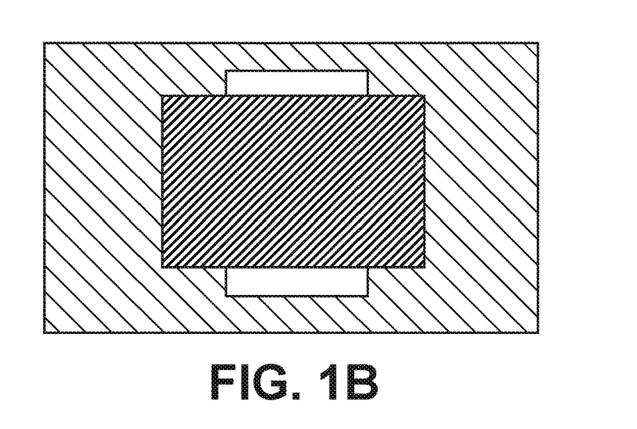

FIGS. 1A & 1B illustrate a conventional FBAR structures. FIG. 1A illustrates a side view of a FBAR structure in which an AlN piezoelectric material is mounted on a Silicon (Si) substrate over an air cavity. As shown in FIG. 1A, electrode metals are deposited on the top and bottom sides of the piezoelectric material. FIG. 1B illustrates a top view of the FBAR structure. As discussed above, it is difficult to manufacture multiple filters (e.g., piezoelectric+electrodes) on a common substrate.

Figure 2:
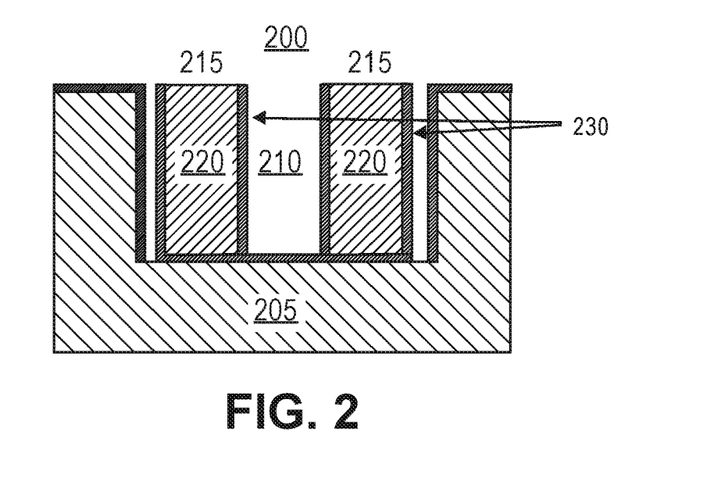
FIG. 2 illustrates one embodiment of an acoustic resonator structure.

According to one embodiment, a novel acoustic resonator structure is disclosed that includes multiple filters to be implemented by a RF front end. In a further embodiment, the resonator structure includes a piezoelectric that includes epitaxial growth of an AlN layer for crystalline and a higher quality piezoelectric film. FIG. 2 illustrates one embodiment of an acoustic resonator structure 200. Resonator structure 200 includes substrate 205 and resonators 215 within a vertical cavity (or trench) 210 of substrate 205. In one embodiment, substrate 205 is comprised of silicon (Si). However, substrate 205 may be comprised of other materials (e.g., silicon dioxide (SiO2), aluminum oxide ($Al_2O_3$), germanium, etc.).

In one embodiment, each resonator 215 comprises an electrode layer 230 deposited on an AlN piezoelectric film layer 220. An electrode layer 230 is also deposited on sidewalls of substrate 205. According to one embodiment, piezoelectric film layer 220 is deposited via epitaxial growth, which enables fine control of the piezoelectric film layer 220 thickness. In a further embodiment, epitaxial growth of piezoelectric film layer 220 creates a single crystal film, which eliminates phonon scattering at grain boundaries and can enhance coupling coefficient. Accordingly, the quality (Q) factor of resonator 200 is improved.

Figure 3:
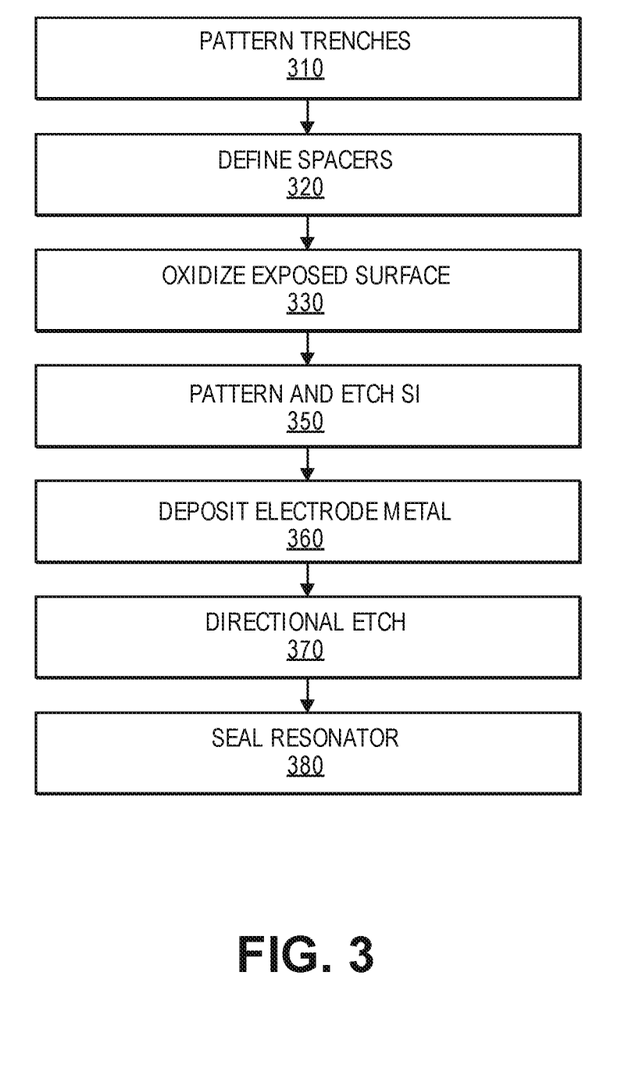
FIG. 3 is a flow diagram illustrating one embodiment of a process for fabricating an acoustic resonator structure.
Figure 4A:
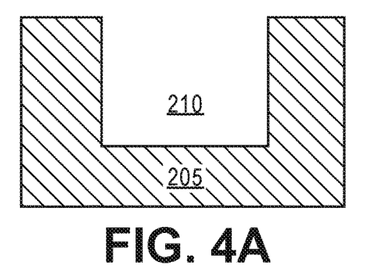
FIGS. 4A-4G illustrate embodiments of an acoustic resonator structure during fabrication.

FIG. 3 is a flow diagram illustrating one embodiment of a process for fabricating a resonator structure 200. At processing block 310, trenches 210 are patterned into substrate 205. In one embodiment, a crystallographic wet etch of the Si substrate is implemented to create an atomically smooth sidewall template for the AlN piezoelectric film layer 220 surface. The crystallographic wet etch facilitates the lowest loss interface, which improves the resonator 215 Q factor; resulting in low insertion loss filters. FIG. 4A illustrates one embodiment of resonator structure 200 after a trench 210 has been etched into substrate 205.

Figure 5A:
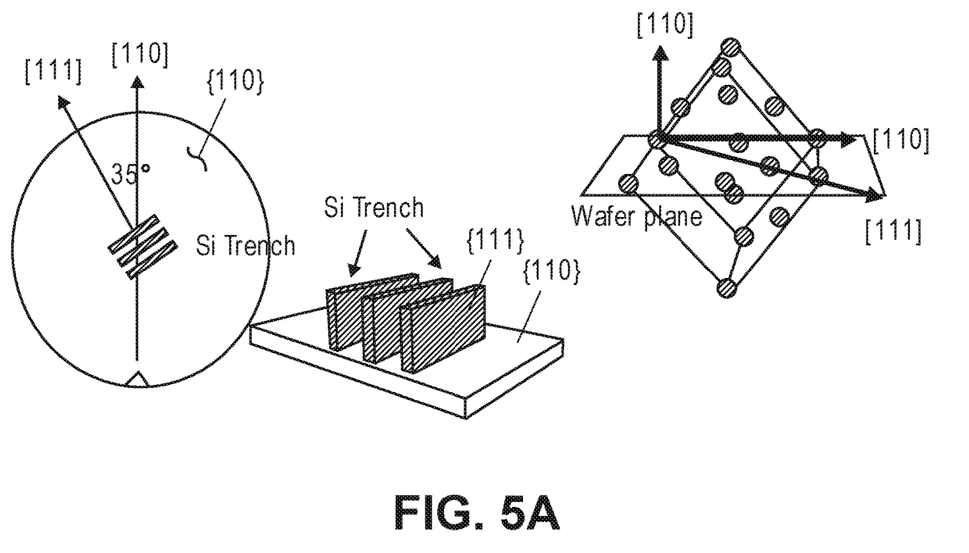
FIGS. 5A & 5B illustrate embodiments of plane orientations of an acoustic resonator structure.
Figure 5B:
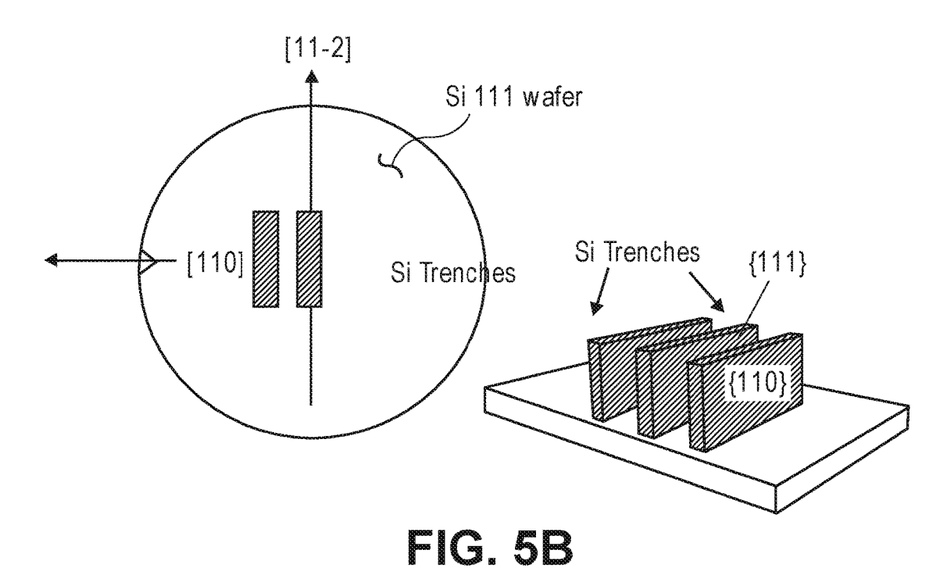

In one embodiment, the etching process begins with lithographically printing an etch mask layer. Subsequently, bulk etching of Si may be accomplished via Reactive-ion etching (RIE) techniques. However, the final etch may be performed with a potassium hydroxide (KOH) wet etch to select specific crystal planes with low etch rates (e.g., a {111} plane orientations) in Si. Specific planes can be selected by aligning the trench pattern on the substrate. A similar technique may be used to preferentially stop on a {110} plane orientation. A mechanism based on etch rates of Si in KOH may be {100} plane orientation >{110} plane orientation >{111} plane orientation. FIG. 5A illustrates one embodiment of a {111} plane orientation of a trench wall relative to a [110] plane of the substrate, while FIG. 5A illustrates one embodiment of a {110} plane orientation relative to a [111] plane of the substrate.

Figure 4B:
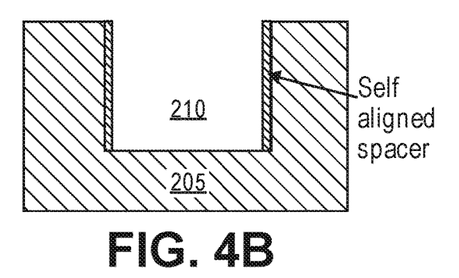
Figure 4C:
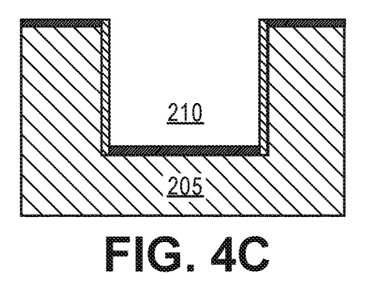
Figure 4D:
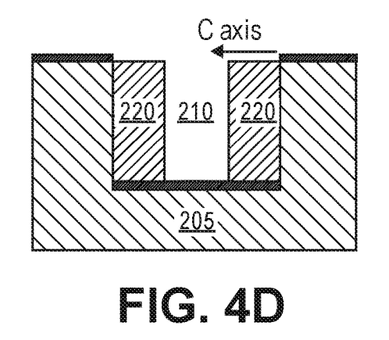

At processing block 320, self-aligned spacers are defined on the sidewalls of substrate 205. FIG. 4B illustrates one embodiment of resonator structure 200 after spacers have been defined. At processing block 330, exposed surfaces of substrate 200 are oxidized. FIG. 4C illustrates one embodiment of resonator structure 200 after oxidation. At processing block 340, the spacers are selectively removed and AlN layers 220 are epitaxially grown. FIG. 4D illustrates one embodiment of resonator structure 200 after the AlN layers 220 have been epitaxially grown.

Figure 4E:
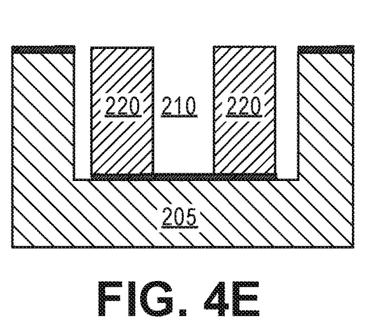
Figure 4F:
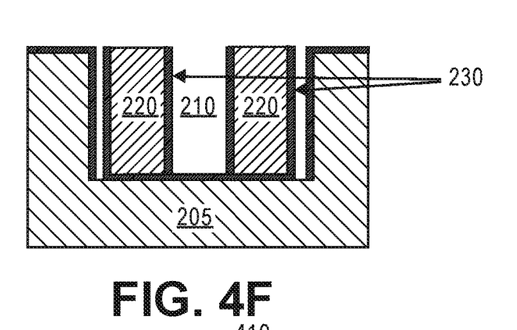

At processing block 350, substrate 200 is patterned and etched to expose the surface of AlN layers 220. FIG. 4E illustrates one embodiment of resonator structure 200 after the surfaces of AlN layers 220 have been exposed. At processing block 360, the electrode 230 metal is deposited. In one embodiment, the electrode metal is deposited using sputter and/or vapor phase decomposition (VPD). At processing block 370, material from the horizontal surfaces is directionally etched. FIG. 4F illustrates one embodiment of resonator structure 200 after the electrode 330 metal has been deposited and the horizontal surfaces have been directionally etched.

Figure 4G:
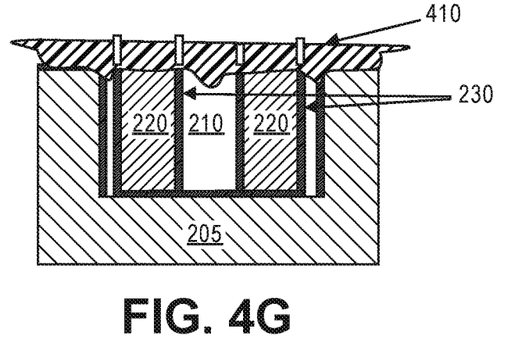

According to one embodiment, additional layers may be added to resonator structure 200. In such an embodiment, resonator structure 200 may be sealed, processing block 380. Sealing may be implemented using features such as breadloafing of chemical vapor deposition (CVD) films or bonding of a cap. Subsequently, vias and additional fabrication may be performed using known technique. FIG. 4G illustrates one embodiment of resonator structure 200 after a sealing process has been performed.

Figure 6:
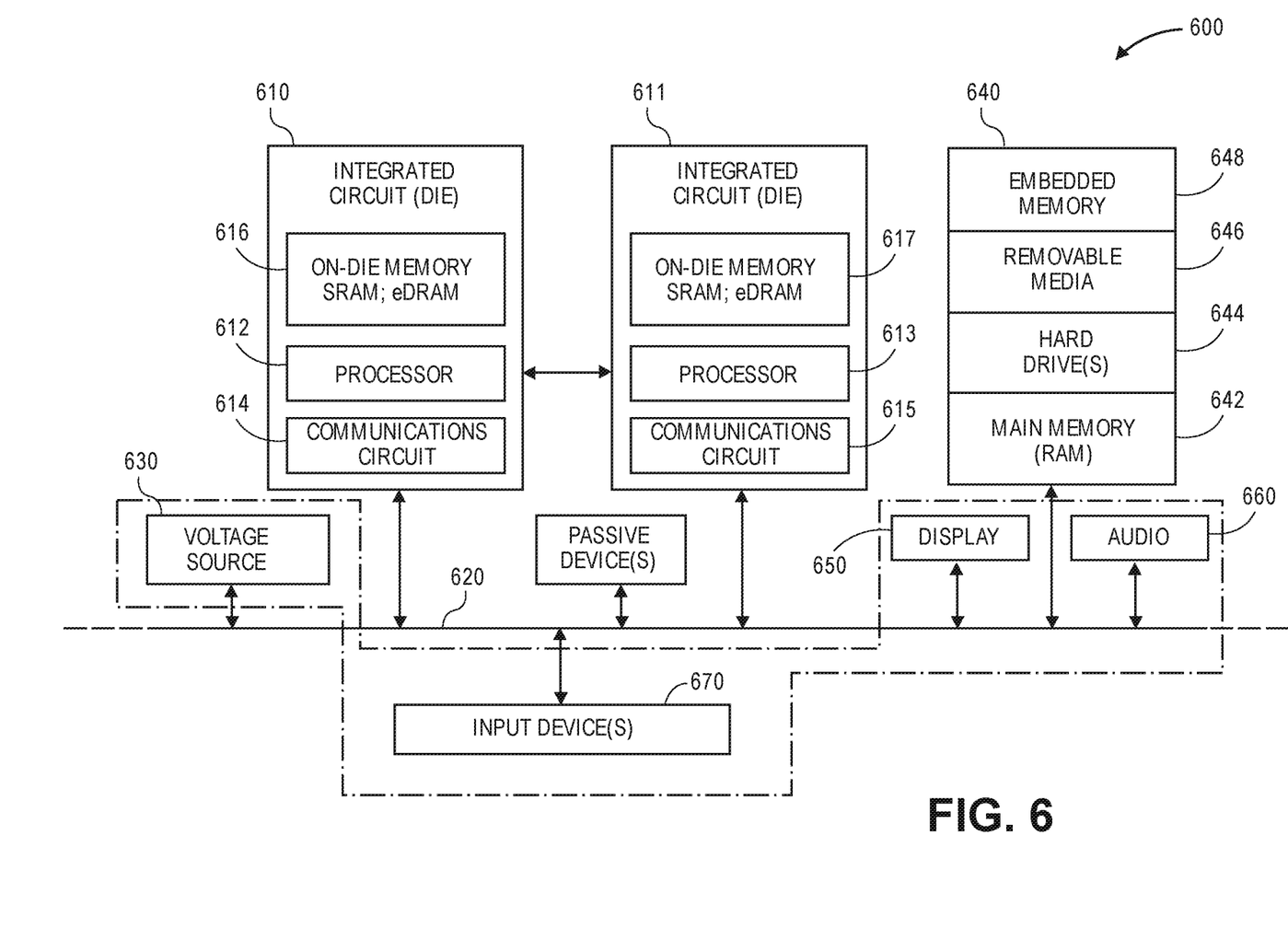
FIG. 6 illustrates a system in which an acoustic resonator structure may be implemented.

FIG. 6 illustrates one embodiment of a computer system 600 in which an acoustic resonator may be implemented. The computer system 600 (also referred to as the electronic system 600) as depicted can embody a semiconductor die packaged with one or more ACIs having metal-density layer units of fractal geometry according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 6. Passive devices may also be included, as is also depicted in FIG. 6.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The following clauses and/or examples pertain to further embodiments or examples. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system for facilitating hybrid communication according to embodiments and examples described herein.

Some embodiments pertain to Example 1 that includes an acoustic resonator structure comprising a substrate including sidewalls; and a vertical cavity between the sidewalls and two or more resonators deposited in the vertical cavity.

Example 2 includes the subject matter of Example 1, wherein each of the two or more resonators comprise a piezoelectric film; and an electrode metal deposited on the piezoelectric film.

Example 3 includes the subject matter of Examples 1 and 2, wherein the piezoelectric film comprises an epitaxially grown aluminum nitride (AlN) layer.

Example 4 includes the subject matter of Examples 1-3, wherein the epitaxial growth of the AlN layer creates a single crystal film.

Example 5 includes the subject matter of Examples 1-4, wherein the electrode metal is further deposited on the sidewalls.

Example 6 includes the subject matter of Examples 1-5, wherein the cavity in the substrate is created via a crystallographic wet etch.

Example 7 includes the subject matter of Examples 1-6, further comprising a sealing layer deposited over the substrate and the two or more resonators.

Some embodiments pertain to Example 8 a method comprising fabricating an acoustic resonator structure, including creating a vertical cavity in a substrate and depositing two or more resonators in the vertical cavity.

Example 9 includes the subject matter of Example 8, wherein creating the cavity in the substrate comprises performing a crystallographic wet etch on the substrate.

Example 10 includes the subject matter of Examples 8 and 9, further comprising defining spacers on sidewalls of the substrate.

Example 11 includes the subject matter of Examples 8-10, further comprising oxidizing exposed surfaces of the substrate.

Example 12 includes the subject matter of Examples 8-11, further comprising removing the spacers and epitaxially growing an aluminum nitride (AlN) layer.

Example 13 includes the subject matter of Examples 8-12, further comprising exposing the AlN layer.

Example 14 includes the subject matter of Examples 8-13, further comprising depositing an electrode metal over the AlN layer to generate the one or more resonators.

Example 15 includes the subject matter of Examples 8-14, depositing a seal layer over the substrate and the one or more resonators.

Some embodiments pertain to Example 16 an integrated circuit (IC) comprising an acoustic resonator structure, including a substrate having a plurality of sidewalls and a vertical cavity between each of the plurality of sidewalls and two or more resonators deposited in each vertical cavity.

Example 17 includes the subject matter of Example 16, wherein each resonator comprises a piezoelectric film and an electrode metal deposited on the piezoelectric film.

Example 18 includes the subject matter of Examples 16 and 17, wherein the piezoelectric film comprises an epitaxially grown aluminum nitride (AlN) layer.

Example 19 includes the subject matter of Examples 16-18, wherein the epitaxial growth of the AlN layer creates a single crystal film.

Example 20 includes the subject matter of Examples 16-19, wherein a vertical cavity in the substrate is created via a crystallographic wet etch.

Example 21 includes the subject matter of Examples 16-20, further comprising a sealing layer deposited over the substrate and the two or more resonators.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An acoustic resonator structure comprising:
   a substrate including:
      sidewalls; and
      a vertical cavity between the sidewalls;
   an oxide of the substrate at a bottom of the vertical cavity; and
   two or more resonators on the oxide in the vertical cavity.

2. The acoustic resonator structure of claim 1, wherein each of the two or more resonators comprise:
   a piezoelectric film; and
   an electrode metal on the piezoelectric film.

3. The acoustic resonator structure of claim 2, wherein the piezoelectric film comprises an aluminum nitride (AlN) layer.

4. The acoustic resonator structure of claim 3, wherein the AlN layer is a single crystal film.

5. The acoustic resonator structure of claim 2, wherein the electrode metal is further on the sidewalls.

6. The acoustic resonator structure of claim 1, wherein the cavity in the substrate is created via a crystallographic wet etch.

7. The acoustic resonator structure of claim 1, further comprising a sealing layer over the substrate and the two or more resonators.

8. An integrated circuit (IC) comprising an acoustic resonator structure, including:
   a substrate comprising:
      a plurality of sidewalls; and
      a vertical cavity between each of the plurality of sidewalls;
   an oxide of the substrate at a bottom of each vertical cavity; and
   two or more resonators in each vertical cavity.

9. The IC of claim 8, wherein each resonator comprises:
   a piezoelectric film; and
   an electrode metal on the piezoelectric film.

10. The IC of claim 9, wherein the piezoelectric film comprises an aluminum nitride (AlN) layer.

11. The IC of claim 10, wherein the AlN layer is a single crystal film.

12. The IC of claim 11, wherein each vertical cavity in the substrate is created via a crystallographic wet etch.

13. The IC of claim 12, further comprising a sealing layer over the substrate and the two or more resonators.

* * * * *